US 10,126,348 B2

(12) United States Patent
Berler et al.

(10) Patent No.: US 10,126,348 B2
(45) Date of Patent: Nov. 13, 2018

(54) COMBINED ON-LINE BUSHING MONITORING AND GEO-MAGNETIC INDUCED CURRENT MONITORING SYSTEM

(71) Applicants: Zalya Berler, Sunny Isles Beach, FL (US); Vladimir Prykhodko, Sunny Isles Beach, FL (US); Joe Watson, North Miami Beach, FL (US)

(72) Inventors: Zalya Berler, Sunny Isles Beach, FL (US); Vladimir Prykhodko, Sunny Isles Beach, FL (US); Joe Watson, North Miami Beach, FL (US)

(73) Assignee: ZTZ Service International, Inc., North Miami Beach, FL (US)

( * ) Notice: Subject to any disclaimer, the term of this patent is extended or adjusted under 35 U.S.C. 154(b) by 0 days.

(21) Appl. No.: 14/943,297

(22) Filed: Nov. 17, 2015

(65) Prior Publication Data

US 2017/0227592 A1    Aug. 10, 2017

Related U.S. Application Data

(60) Provisional application No. 62/154,196, filed on Apr. 29, 2015.

(51) Int. Cl.
| | | |
|---|---|---|
| *G01R 31/02* | (2006.01) | |
| *G01R 31/06* | (2006.01) | |
| *G01R 31/12* | (2006.01) | |
| *G01R 31/28* | (2006.01) | |
| *G01R 31/34* | (2006.01) | |
| *G01R 31/42* | (2006.01) | |
| *H02H 3/00* | (2006.01) | |

(Continued)

(52) U.S. Cl.
CPC ....... *G01R 31/027* (2013.01); *G01R 31/1245* (2013.01)

(58) Field of Classification Search
CPC ............ H02H 7/04; H02H 3/00; H02H 3/093; H02H 3/52; H02H 3/16; G01R 31/027; G01R 31/02; G01R 31/06; G01R 31/12; G01R 31/1227; G01R 31/1263; G01R 31/28; G01R 31/42; G01R 31/34
See application file for complete search history.

(56) References Cited

U.S. PATENT DOCUMENTS 9,018,962 B2    4/2015   Hoffman et al.
2012/0019965 A1*  1/2012   Faxvog ................... H02H 3/52
                                                  361/42

(Continued)

*Primary Examiner* — Neel Shah
(74) *Attorney, Agent, or Firm* — Pablo Meles (57) ABSTRACT

A system for on-line bushing monitoring and geo-magnetically induced current monitoring utilizes a Hall Effect current transducer and obtains the harmonic component of the signals through the measurement of bushing test tap current which provides a more reliable measurement method since the bushings provide a capacitive voltage divider that is not subject to saturation which is a drawback of using current transformers to obtain the signals. The system combines the existing harmonic analysis functions of the bushing monitor measurement system with the measured neutral direct current to provide an economical and efficient system that monitors both bushing condition and GIC conditions with one common monitoring module.

9 Claims, 5 Drawing Sheets

100
System Configuration (51) Int. Cl.
*H02H 3/16* (2006.01)
*H02H 7/04* (2006.01)

(56) References Cited

U.S. PATENT DOCUMENTS

2013/0285671 A1* 10/2013 Hoffman ............... G01R 31/027
    324/547
2014/0163911 A1*  6/2014 Rohrer ................. G01R 33/072
    702/64
2014/0368215 A1* 12/2014 Hoffman ................ G01R 15/16
    324/552

* cited by examiner

FIG. 1 – System Configuration

FIG. 2 – Bushing Monitoring and GIC Detection Algorithm

FIG. 3 – Transformer Winding Connections

FIG. 4 – Sensor installation showing bushing sensor and DC neutral current transducer locations

500

FIG. 5 – General Wiring Diagram

COMBINED ON-LINE BUSHING MONITORING AND GEO-MAGNETIC INDUCED CURRENT MONITORING SYSTEM

This application claims priority from U.S. Provisional Application No. 62/154,196, filed Apr. 29, 2015 for Combined On-Line Bushing Monitoring and Geo-magnetic Induced Current Monitoring System.

FIELD

The embodiments herein can be applied to power transformers on transmission networks that are susceptible to Geo-magnetic induced currents or other abnormal DC ground current conditions.

BACKGROUND

Solar flares and solar mass ejections can induce a rise in ground potential in the areas where the charged particles interact with the earth's magnetic field. When electrical power transmission lines connect two points with substantial potential difference in the two ground potentials, a direct current (DC) is transmitted over the transmission line, in the same way that a DC current is transmitted over a wire connecting two battery terminals. Transmission lines are normally terminated to a large power transformer that transforms the transmission line voltage to a different level for generation or distribution purposes.

When significant levels of DC current are applied together with AC voltages and currents, the DC can offset the normally balanced flux in the transformer core and cause the core to saturate every half cycle. The degree of saturation is dependent on the design of the core, the electrical characteristics of the steel used in the core, and the level of DC current applied to the core. A saturated core will cause large spikes in the transformer currents which can cause severe noise and over-heating problems. Catastrophic transformer failures have occurred as a result of Geo-magnetic induced currents that the transformers were not protected against.

Figure 3:
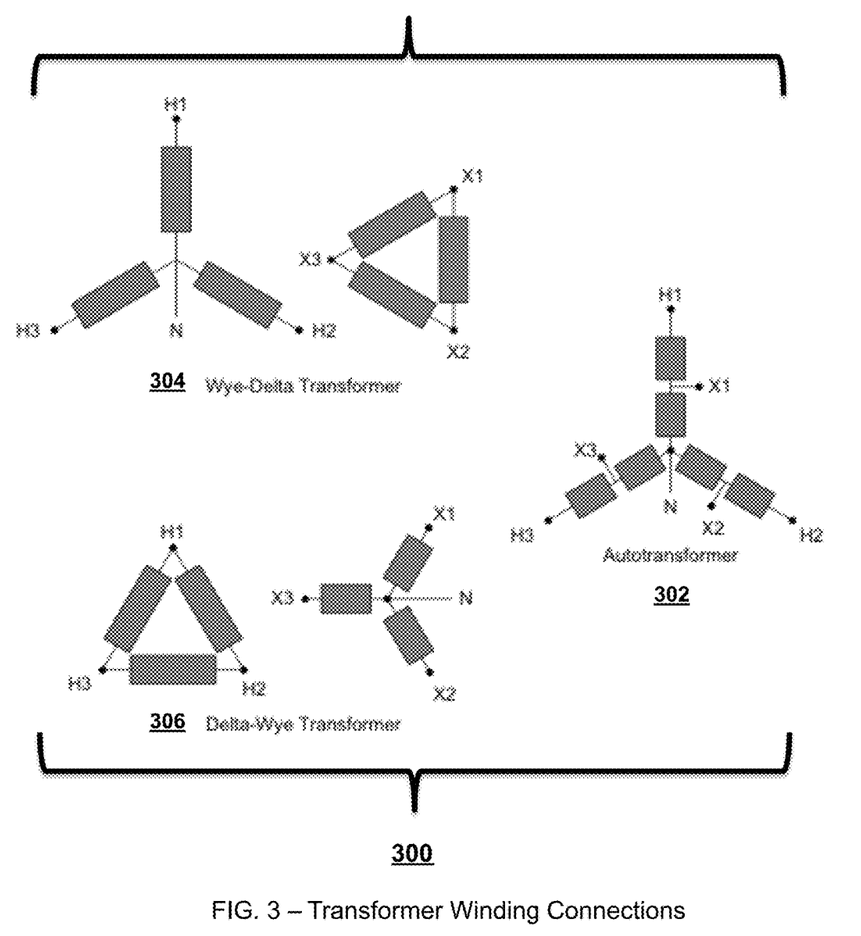
FIG. 3 includes block diagrams of 3 common types of transformer winding configurations including a Wye-Delta Transformer, a Delta-Wye Transformer, and an Autotransformer.

Different types of transformer designs are more susceptible to damage from Geo-magnetic induced current events. While the detection of DC current in the transformer's neutral is a primary indicator of a Geo-magnetic induced current event or other abnormal DC conditions, the level of even and odd harmonics are also good indicators of the degree of core saturation and resulting damage that can occur to each individual transformer. FIG. 3 shows 3 common types of transformer winding configurations 300. Autotransformers 302 are widely used for transmission line transformation, but Wye-delta transformers 304 or Delta-wye transformers 306 may be used in some applications. Transformers with neutral terminals on the transmission-side windings (typically the HV windings) are most susceptible to Geo-magnetic induced current effects, but other design criteria such as single-phase and/or shell-form transformer designs can also have a significant influence of the susceptibility to damage from Geo-magnetic induced current events.

There are established methods of protecting transformers from Geo-magnetic induced current events. Some options include the use of DC shunting or blocking filters or switches to remove the transformer from the transmission line, but all such protection systems depend on an accurate detection of the Geo-magnetic induced current condition which the various embodiments herein provides.

The measurement of DC neutral current is standard industry practice and utilized in all current art Geo-magnetic induced current monitoring systems, but the current art Geo-magnetic induced current monitoring system, utilizes auxiliary current transformers which are susceptible to saturation and inaccurate performance under high current or currents with a significant amount of DC current.

The current art also utilizes stand-alone bushing monitoring systems and stand-alone Geo-magnetic induced current monitoring systems. The embodiments herein are the first to combine the two functionalities into one common transformer monitoring device.

DETAILED DESCRIPTION

Figure 1:
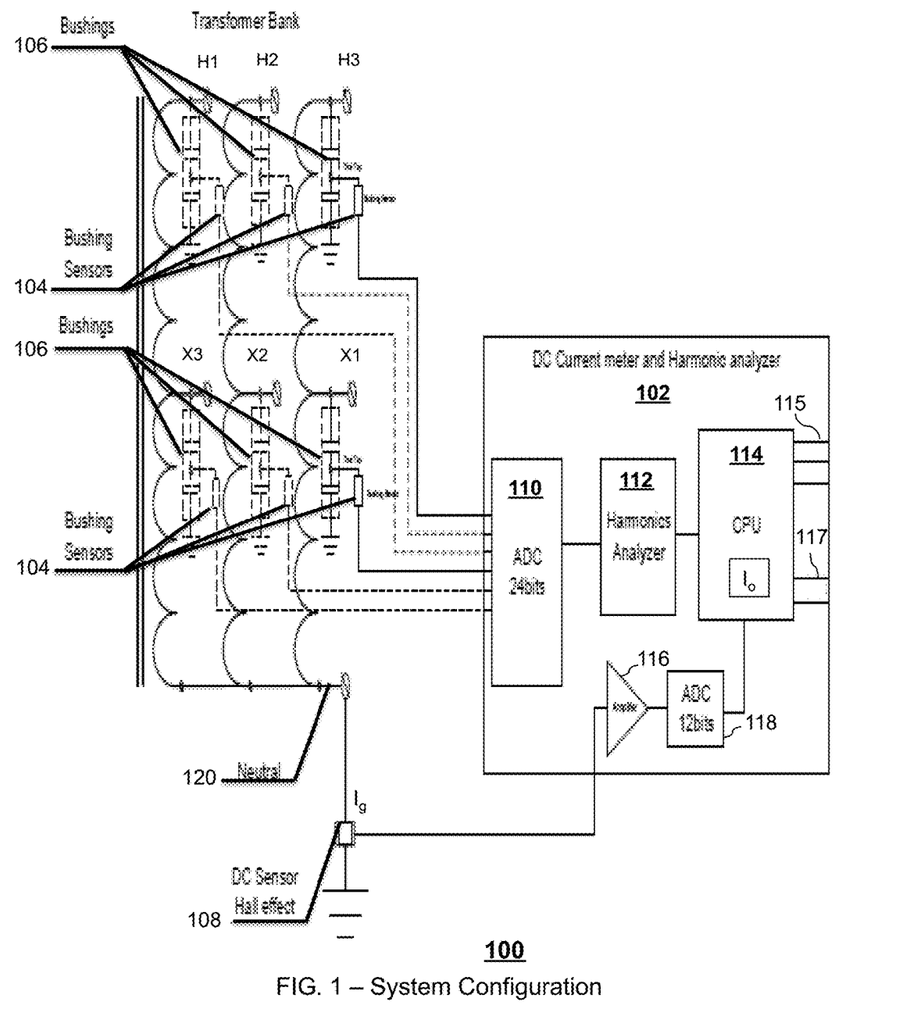
FIG. 1 is a block diagram illustrating a combined on-line bushing monitoring and geo-magnetic induced current monitoring system in accordance with the embodiments.

The embodiments herein combine on-line bushing monitoring and Geo-magnetic induced current monitoring as a system 100 as shown in FIG. 1. The system is comprised of a central measurement, data processing and communication (MDC) module 102 with a bushing sensor 104 for each bushing 106 and a Hall-effect current transducer 108. Note that existing Geomagnetic Induced Current (GIC) monitoring systems for power transformers and related equipment employ a Hall Effect current transducer on the neutral bus for detection of direct current in the transformer neutral, and the use of auxiliary current transformers for the detection of harmonic currents resulting from half-cycle saturation of the transformer core due to the induced direct current in the transmission line connected to the transformer windings. The current art in on-line transformer bushing monitoring systems measures the test tap current or voltage and processes the signal using Fourier transformation to permit the comparison of signals and calculation of bushing power factor and capacitance values. A system for on-line bushing monitoring and geo-magnetically induced current monitoring in the embodiments herein can utilize a Hall Effect current transducer in the same manner as the current art for GIC monitoring, but obtains the harmonic component of the signals through the measurement of bushing test tap current which provide a more reliable measurement method since the bushings provide a capacitive voltage divider that is not subject to saturation which is a drawback of using current transformers to obtain the signals. The embodiments herein combines the existing harmonic analysis functions of the bushing monitor measurement system with the measured neutral direct current to provide an economical and efficient system that monitors both bushing condition and GIC conditions with one common monitoring module.

The system provides bushing power factor, capacitance and imbalance output data as well as the DC component of the transformer's neutral current and harmonic voltage components for the system voltage up to the $10^{th}$ harmonic (600 Hz for a 60 Hz power system or 500 Hz for a 50 Hz system).

The system also includes local and remote alarm outputs for bushing condition and GEO-MAGNETIC event detection.

The embodiments disclosed herein describe a combined on-line bushing monitoring and Geo-magnetic induced current monitoring system in one common module. In one embodiment as shown in FIG. 1, the system 100 is comprised of a central measurement, data processing and communication (MDC) module 102 that includes an analog to digital converter 110 that receives the signals from the respective bushing sensor 104 for each bushing 106 and wherein the ADC 110 is coupled to a harmonics analyzer 112 which is coupled to a central processing unit or CPU 114. The module 102 further includes an amplifier 116 and ADC 118 that receives the signal from the Hall effect current transducer 108.

Figure 4:
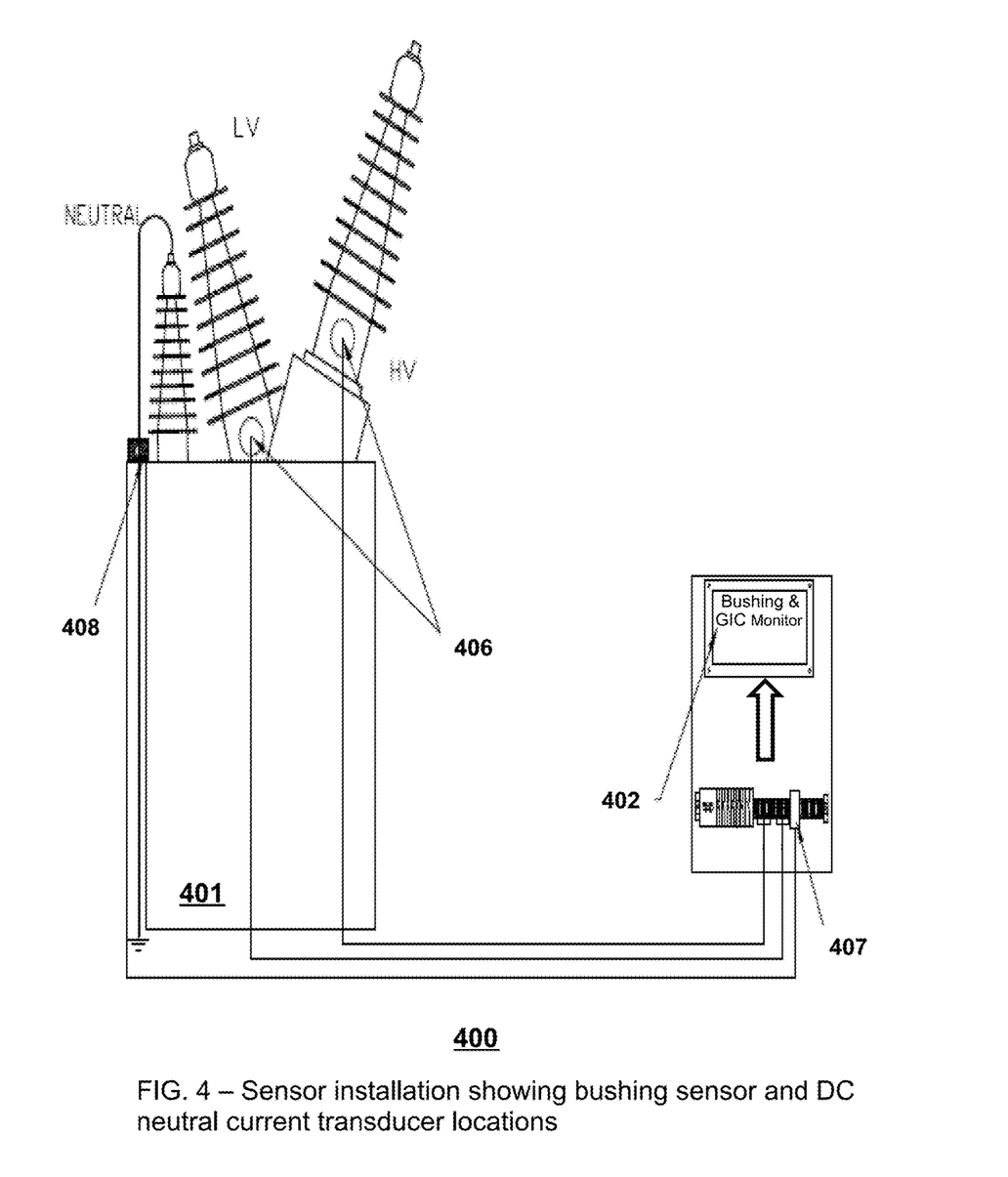
FIG. 4 is a block diagram illustrating sensor installations showing bushing sensor and DC neutral current transducer locations in accordance with an embodiment.
Figure 5:
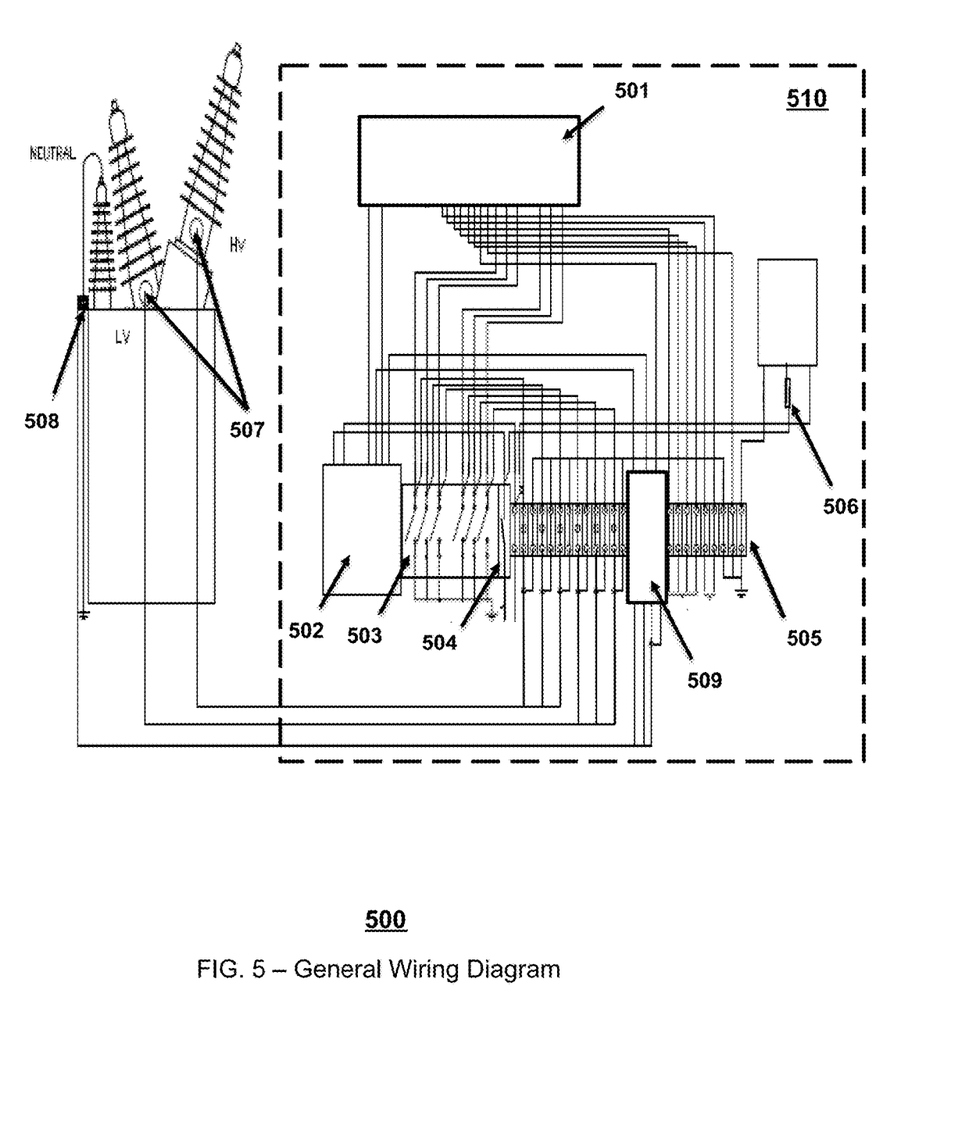
FIG. 5 is a general wiring diagram for a combined on-line bushing monitoring and geo-magnetic induced current monitoring system in accordance with the embodiments.

In the embodiment shown in FIG. 1, the bushing sensors 106 connect to the test tap on each high voltage (HV) bushing and connect the test tap current and voltage to the central MDC module 102. For bushing monitoring purposes, each condenser-type bushing, with the exception of neutral bushings, should be equipped with a bushing sensor. For GEO-MAGNETIC monitoring purposes, the HV bushings, connected to the transmission line, should be equipped with bushing sensors. The bushing monitoring system can be utilized without the Geo-magnetic induced current functionality, if Geo-magnetic induced current (GIC) monitoring is not required for that site or transformer. See FIGS. 4 and 5 for typical bushing sensor mounting locations. For example, in FIG. 4, a monitoring system 400 for monitoring a transformer 401 includes bushing sensors 406 on respective High Voltage and Low Voltage bushings and a Hall effect current transducer or Rowgowski coil 408 at the base of the transformer's neutral bushing. The signals from the bushing sensors 406 and the transducer 408 are provided to a bushing and Geomagnetic Induced Current (GIC) monitoring system 402. The signal from the transducer 408 can be an input to GIC monitoring input device 407. Referring to FIG. 5, a general wiring diagram for monitoring system 500 includes bushing sensors 507 on respective High Voltage and Low Voltage bushings and a Hall effect current transducer or Rowgowski coil 508 at the base of the transformer's neutral bushing. The signals from the bushing sensors 507 and the transducer 508 are ultimately fed to a bushing and Geomagnetic Induced Current (GIC) monitoring module 501 within the remote module 510. In one embodiment as shown, the module 510 can include a power supply 502 coupled to a switching circuit or IC connect link 503 and circuit breaker 504. The input signals from the bushing sensors 507 and the transducer 508 are fed as inputs through a terminal block 505 and GIC input block 509. The module 510 can further include an in-line thermostat 506.

Referring back to FIG. 1, the Hall-effect current transducer 108 is installed around the transformer's neutral ground bus 120 and provides the DC current component of the neutral current to the MDC module 102. The use of the Hall-effect current transducer has been the industry standard practice for measurement of DC currents for years and not claimed as unique by this application. See FIGS. 4 and 5 for typical current transducer mounting locations.

FIG. 1 shows the schematic configuration of the system. In some embodiments, the bushing test tap voltages and currents are converted from analog signals to 24 bit digital data using the ADC 110, for example, and then Fourier analysis is applied to obtain the simultaneous $1^{st}$ through $10^{th}$ harmonic components of each input signal which can be performed by the harmonics analyzer 112. The data is then analyzed with the central processing unit 114 to calculate individual bushing leakage current magnitude and phase angle, bushing power factor, capacitance and imbalance current levels as part of the bushing monitoring function. In some embodiments, the input from the Hall-effect current transducer 108 is amplified by an amplifier 116 and then converted from an analog to 12 bit digital data using the ADC 118 for example. The data is then processed by the central processing unit 114 to provide a DC neutral current magnitude output. The harmonic levels for each harmonic bushing voltage, as calculated for the bushing monitoring function, are output for the Geo-magnetic induced current monitor data over the communications network.

Figure 2:
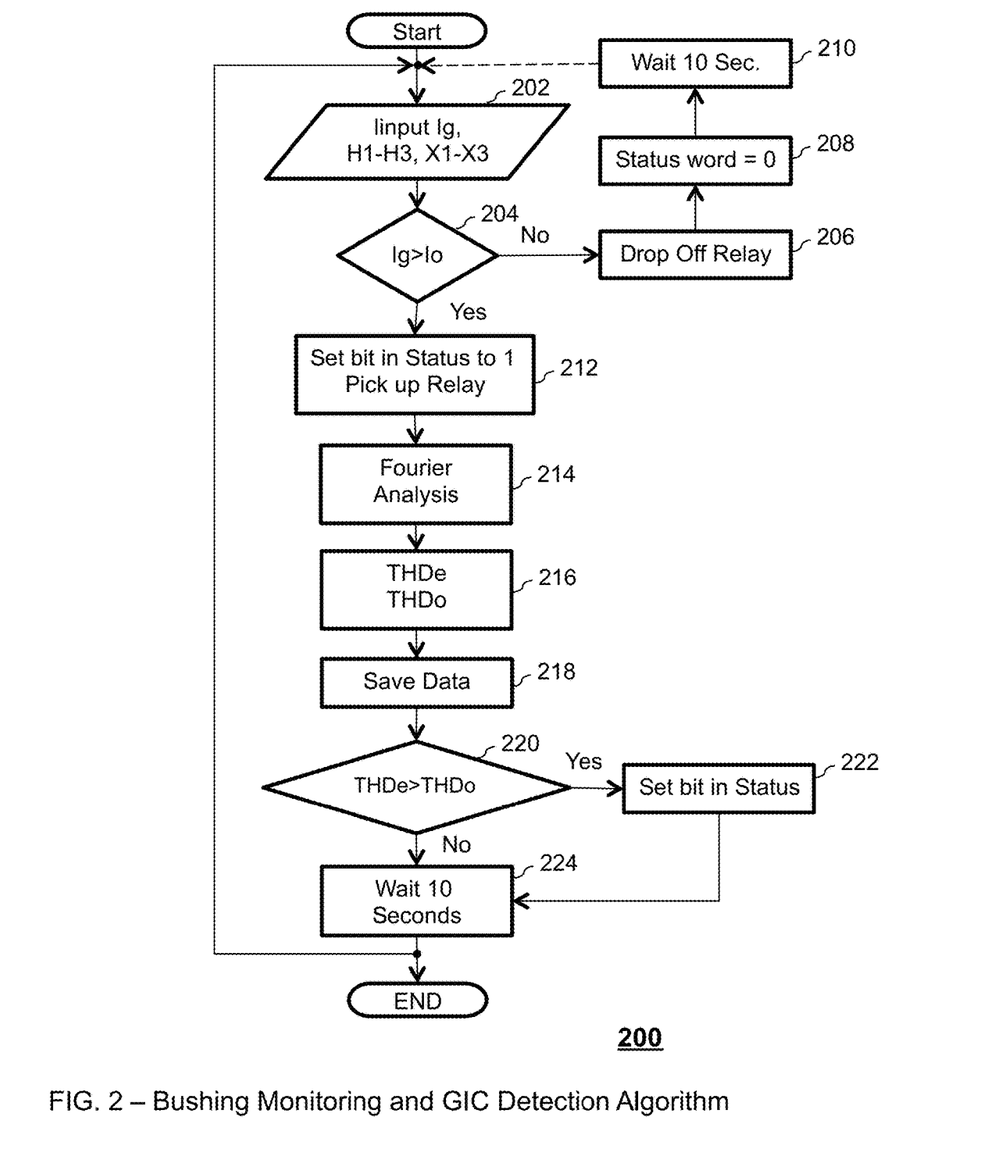
FIG. 2 is a flow chart depicting a bushing monitoring and geo-magnetic induced current detection algorithm in accordance with the embodiments.

FIG. 2 shows a flow chart of an exemplary analysis algorithm 200 with measurement and calculation of harmonic content and total harmonic distortion used by both the bushing monitor and the Geo-magnetic induced current monitoring system. More specifically, referring to a particular embodiment in FIG. 2, the algorithm 200 looks at the input current $I_{input}$ and ground current Ig at step 202 and determines if the ground current is greater than a set threshold current ($I_0$) at decision step 204. If the ground current is not greater than the set threshold current at decision step 204, then the Relay is dropped off at step 206, the Status Word is set to zero (0) at 208, and the system waits 10 seconds at 210 before returning to step 202. If the ground current is greater than the set threshold current at decision step 204, then a bit in "Status" is set (to 1, for example) and the Relay is picked up at 212. At step 214, the signals from the bushing sensors (see 104 in FIG. 1) Hall effect current transducer (see 108 of FIG. 1) are analyzed using Fourier Analysis at step 214 and Total Harmonic Distortion (THD) is calculated at step 216. The data is then saved at step 218. At decision step 220, if the THDe is greater than set threshold THD (THDo), then a bit is set (to 1, for example) in the "Status" at 222 and the system waits 10 seconds at 224 before returning to step 202. If the THDe is not greater than THDo, then the algorithm 200 waits 10 seconds at 224 and returns to step 202.

The system in some embodiments can be configured to provide local and remote alarms (see outputs 115 in FIG. 1). Local alarms can consist of form-C contacts to activate relays or local alarm systems. The remote alarms can be binary alarm codes included with the remote communications data. Alarm levels can be set for various levels of bushing power factor magnitude or rate of change, Bushing capacitance magnitude or rate of change, bushing imbalance current magnitude or rate of change, DC neutral current magnitude or rate of change, and harmonic voltage magnitude for the $1^{st}$ through $10^{th}$ harmonic.

The bushing monitor and Geo-magnetic induced current monitor system can also be connected to a common transformer monitoring system consisting of other measured parameters that can be affected by Geo-magnetic induced current conditions such as dissolved gas-in-oil, elevated transformer oil temperatures or elevated transformer noise or tank vibration levels.

The communications network provides local and remote data over TCP/IP, Modbus, DNP 3.0 and IEC 61850 protocols over RS485, RS232 (see outputs 117 in FIG. 1), Ethernet or other available connections using fiber optic, wire, cellular or radio transmission.

In summary, several of the embodiments present an on-line transformer monitoring system that monitors both bushing condition and the presence of geo-magnetic induced, or other direct current (DC) currents into an energized transformer within one common system. In some embodiments of such a system, the system measures the harmonic currents generated by half-cycle core saturation, produced by geo-magnetic induced currents, or other conditions that introduce a DC component onto the power system and into the transformer, by measuring the voltages at each bushing's test tap, which, as an effective capacitive voltage divider, is not susceptible to saturation which can occur with direct measurement of harmonic current using current transformers. The monitoring system can employ the same sensors attached to the same bushings and measuring the bushing leakage voltage and current, for both the bushing monitoring functions and the geo-magnetic induced current functions. The system can further utilize Fourier analysis of the common signal for the algorithms used to determine the bushing power factor and capacitance as well as determine the harmonic current/voltage content. In some embodiments, the system can include the measurement of the direct current component of the transformer's neutral current to also detect the presence of geomagnetic induced currents or other DC currents into the transformer. Such a system can include remote telemetry including bushing power factor and capacitance for each monitored bushing, harmonic voltage content for $1^{st}$ through $10^{th}$ harmonics, and the magnitude of neutral DC current. The system can also provide local and remote alarms in the event that bushing deterioration is detected or a geomagnetic induced current event is detected. In some embodiments, the system can operate as a stand-alone system or alternatively as a modular component in a more complete transformer monitoring system.

What is claimed is:

1. An on-line transformer monitoring system for monitoring a transformer having a plurality of bushings, comprising:
   one or more bushing sensors on at least each high voltage bushing and low voltage bushing of the plurality of bushings monitoring a bushing condition of the transformer and providing at least a first signal;
   one or more Hall effect sensors installed around a neutral ground bus of the transformer, wherein the one or more Hall effect sensors monitors a presence of geo-magnetic induced currents, and providing at least a second signal;
   an analyzer module having one or processors configured to:
      receive at least the first signal and the second signal;
      digitize and analyze harmonics of the first signal to provide a digitized first signal;
      amplify and digitize the second signal to provide a digitized second signal;
      process the first digitized signal and the second digitized signal to provide in a single device an output reflecting a measurement of both the geo-magnetic induced currents and the bushing condition for each low voltage and high voltage bushing of the plurality of bushings;
      generating local and remote alarms from the single device in response to a detection of an event indicating either one of a bushing deterioration at any one of high voltage or low voltage bushings of the plurality of bushings or the geo-magnetic induced current; and
   wherein the system measures harmonic currents produced by the geo-magnetic induced currents by measuring voltages at each bushing's test tap of the transformer which provides a capacitive voltage divider in a manner unsusceptible to saturation.

2. The system of claim 1, wherein the system employs the bushing sensors where each bushing sensor is attached to a bushing of the plurality of bushings of the transformer and measuring a bushing leakage voltage and current, for both the bushing monitoring functions and the geo-magnetic induced current functions.

3. The system of claim 2, wherein the system further utilizes Fourier analysis of a common signal of the transformer to determine the bushing power factor and capacitance to determine a harmonic current or voltage content.

4. The system of claim 1, wherein a measurement of a direct current component of the transformer's neutral current is also used to detect the presence of geo-magnetic induced currents.

5. The system of claim 1, wherein the system comprises remote telemetry including bushing power factor and capacitance for each monitored bushing, harmonic voltage content for $1^{st}$ through $10^{th}$ harmonics, and the magnitude of a neutral DC current.

6. The system of claim 1, further comprising outputs for the local and remote alarms at the single device in the event of detection of the bushing deterioration or the geomagnetic induced current.

7. The system of claim 1, wherein the system operates as a stand-alone system or as a modular component in a more complete transformer monitoring system, where the analyzer module is further configured to calculate individual bushing leakage current magnitude and phase angle, bushing power factor, capacitance, and imbalance current levels as part of the bushing monitoring function.

8. A method of on-line transformer monitoring for a transformer having a plurality of bushings, comprising:
   monitoring, by one or more bushing sensors for each high and low voltage bushing of the plurality of bushings, a bushing condition of a transformer and providing at least a first signal;
   monitoring, by one or more Hall effect sensors installed around a neutral ground bus of the transformer, a presence of geo-magnetic induced currents and providing at least a second signal;
   digitizing and analyzing, by an analyzer module having one or processors, the harmonics of the first signal to provide a digitized first signal;
   amplifying and digitizing the second signal to provide a digitized second signal;
   processing the first digitized signal and the second digitized signal to provide in a single device an output reflecting a measurement of both the geo-magnetic induced currents and the bushing condition;
   generating local and remote alarms from the single device in response to a detection of an event indicating either one of a bushing deterioration or the geo-magnetic induced current; and
   measuring harmonic currents produced by geo-magnetic induced currents by measuring voltages at each bushing's test tap of the transformer which provides a capacitive voltage divider in a manner unsusceptible to saturation.

9. The method of claim 8, wherein the method employs the bushing sensors attached to each high voltage and low voltage bushing of the plurality of bushings of the transformer to measure the bushing leakage voltage and current, for both the bushing monitoring functions and the geo-magnetic induced current functions.

* * * * *